(12) United States Patent
Wang et al.

(10) Patent No.: US 11,730,035 B2
(45) Date of Patent: Aug. 15, 2023

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Ling Wang, Beijing (CN); Yicheng Lin, Beijing (CN); Guoying Wang, Beijing (CN); Ying Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 111 days.

(21) Appl. No.: 17/253,093

(22) PCT Filed: Jun. 30, 2020

(86) PCT No.: PCT/CN2020/099349
§ 371 (c)(1),
(2) Date: Dec. 16, 2020

(87) PCT Pub. No.: WO2021/063053
PCT Pub. Date: Apr. 8, 2021

(65) Prior Publication Data
US 2021/0280645 A1 Sep. 9, 2021

(30) Foreign Application Priority Data

Sep. 30, 2019 (CN) .......................... 201910941914.0

(51) Int. Cl.
*H01L 27/32* (2006.01)
*H10K 59/35* (2023.01)
(Continued)

(52) U.S. Cl.
CPC ......... *H10K 59/353* (2023.02); *H10K 50/865* (2023.02); *H10K 59/131* (2023.02);
(Continued)

(58) Field of Classification Search
CPC ............. H01L 27/3218; H01L 27/3227; H01L 27/3276; H01L 51/5284; H01L 51/56
(Continued)

(56) References Cited

U.S. PATENT DOCUMENTS

2017/0078513 A1\* 3/2017 Chang ...................... G09G 3/36
2017/0154943 A1 6/2017 Yang et al.
(Continued)

FOREIGN PATENT DOCUMENTS

CN 104867450 A 8/2015
CN 105514029 A 4/2016
(Continued)

OTHER PUBLICATIONS

Machine English Translation of CN 110047906 (Year: 2019).\*
(Continued)

*Primary Examiner* — Dzung Tran
(74) *Attorney, Agent, or Firm* — McCoy Russell LLP (57) ABSTRACT

Provided are a display substrate, a manufacturing method thereof and a display device. The display substrate includes a base and a plurality of subpixels arranged on the base in an array form. Each subpixel includes a light-emitting element, a subpixel driving circuitry coupled to the light-emitting element, and a light-emission detection circuitry configured to detect luminescence of light emitted by the light-emitting element. The light-emission detection circuitry includes a first control transistor and a PIN-type photodiode laminated in that order in a direction away from the base, a first electrode of the first control transistor is coupled to a cathode of the PIN-type photodiode, and an orthogonal projection of the first control transistor onto the base at least partially overlaps an orthogonal projection of the PIN-type photodiode onto the base. The display substrate provided by the present disclosure is used for display.

16 Claims, 3 Drawing Sheets

(51) Int. Cl.
    *H10K 50/86* (2023.01)
    *H10K 59/60* (2023.01)
    *H10K 59/131* (2023.01)
    *H10K 71/00* (2023.01)
    *H10K 59/12* (2023.01)

(52) U.S. Cl.
    CPC ............ *H10K 59/60* (2023.02); *H10K 71/00* (2023.02); *H10K 59/1201* (2023.02)

(58) Field of Classification Search
    USPC .......................................................... 257/40
    See application file for complete search history.

(56) References Cited

U.S. PATENT DOCUMENTS

| | | | | |
|---|---|---|---|---|
| 2018/0053032 | A1* | 2/2018 | Ding | G06V 40/1318 |
| 2018/0060641 | A1* | 3/2018 | Kim | G06V 40/1324 |
| 2018/0210571 | A1* | 7/2018 | Wang | G06F 3/0412 |
| 2019/0006441 | A1* | 1/2019 | Ling | H01L 27/3265 |
| 2019/0025971 | A1* | 1/2019 | Li | G06F 3/0412 |
| 2019/0067385 | A1* | 2/2019 | Xu | H01L 27/3244 |
| 2019/0148473 | A1* | 5/2019 | Yamazaki | H01L 33/36 313/504 |
| 2019/0198543 | A1 | 6/2019 | Guo et al. | |
| 2021/0118970 | A1 | 4/2021 | Song et al. | |

FOREIGN PATENT DOCUMENTS

| | | |
|---|---|---|
| CN | 107248518 A | 10/2017 |
| CN | 108538255 A | 9/2018 |
| CN | 109166896 A | 1/2019 |
| CN | 110047906 A | 7/2019 |
| CN | 110226194 A | 9/2019 |
| CN | 110660356 A | 1/2020 |

OTHER PUBLICATIONS

State Intellectual Property Office of the People's Republic of China, Office Action and Search Report Issued in Application No. 201910941914.0, dated Aug. 3, 2020, 15 pages. (Submitted with Partial Translation).

ISA China National Intellectual Property Administration, International Search Report and Written Opinion Issued in Application No. PCT/CN2020/099349, dated Sep. 24, 2020, WIPO, 14 pages.

* cited by examiner

DISPLAY SUBSTRATE, MANUFACTURING METHOD THEREOF, AND DISPLAY DEVICE

CROSS-REFERENCE TO RELATED APPLICATION

The present application claims a priority of the Chinese patent application No. 201910941914.0 filed in China on Sep. 30, 2019, which is incorporated herein by reference in its entirety.

TECHNICAL FIELD

The present disclosure relates to the field of display technology, in particular to a display substrate, a manufacturing method thereof, and a display device.

BACKGROUND

Organic Light-Emitting Diode (OLED) display substrate has been widely used in the display field, e.g., mobile phone, tablet computer and digital camera, due to such advantages as low power consumption, low manufacture cost, self-luminescence, wide viewing angle and rapid response.

SUMMARY

In a first aspect, the present disclosure provides in some embodiments a display substrate, including a base and a plurality of subpixels arranged on the base in an array form. Each of at least one of the subpixels includes a light-emitting element, a subpixel driving circuitry coupled to the light-emitting element, and a light-emission detection circuitry configured to detect luminescence of light emitted by the light-emitting element. The light-emission detection circuitry includes a first control transistor and a PIN-type photodiode laminated in that order in a direction away from the base, a first electrode of the first control transistor is coupled to a cathode of the PIN-type photodiode, and an orthogonal projection of the first control transistor onto the base at least partially overlaps an orthogonal projection of the PIN-type photodiode onto the base.

In a possible embodiment of the present disclosure, the PIN-type photodiode includes a cathode, a photovoltaic conversion structure and an anode laminated in that order in the direction away from the base, the cathode is made of a light-shielding material, and the orthogonal projection of the first control transistor onto the base is located within an orthogonal projection of the cathode onto the base.

In a possible embodiment of the present disclosure, the plurality of subpixels are divided into a plurality of subpixel groups arranged in an array form, each of the subpixel groups includes at least four subpixels arranged in an array form, the at least four subpixels are arranged in two adjacent rows, the same light-emission detection circuitry is shared by the subpixels in a same one of the subpixel groups, and the orthogonal projection of the PIN-type photodiode in the light-emission detection circuitry onto the base overlaps orthogonal projections of the light-emitting elements of the subpixels in the subpixel group corresponding to the light-emission detection circuitry onto the base.

In a possible embodiment of the present disclosure, the display substrate further includes a reference signal line, a first sensing signal line and a first control signal line, wherein the reference signal line is coupled to the anode of the PIN-type photodiode, the first sensing signal line is coupled to a second electrode of the first control transistor, the first control signal line is coupled to a gate electrode of the first control transistor; the plurality of subpixels include a plurality of rows of pixels and a plurality of columns of subpixels, each of the rows of subpixels includes a plurality of subpixels arranged sequentially in a first direction, each of columns of subpixels includes a plurality of subpixels arranged sequentially in a second direction intersecting with the first direction, the same first reference signal line and the same control signal line are shared by the light-emission detection circuitries in a same row in the first direction; the same first sensing signal line is shared by the light-emission detection circuitries in a same column in the second direction.

In a possible embodiment of the present disclosure, an orthogonal projection of the reference signal line onto the base overlaps each of orthogonal projections of the PIN-type photodiodes coupled to the reference signal line onto the base.

In a possible embodiment of the present disclosure, the reference signal line and the PIN-type photodiode are laminated in that order in the direction away from the base.

In a possible embodiment of the present disclosure, an orthogonal projection of the first control signal line onto the base overlaps orthogonal projections of the PIN-type photodiodes in the light-emission detection circuitries coupled to the first control signal line onto the base.

In a possible embodiment of the present disclosure, the first control signal line and the PIN-type photodiode are laminated in that order in the direction away from the base.

In a possible embodiment of the present disclosure, the light-emission detection circuitry further includes a storage capacitor, a first electrode plate of the storage capacitor is coupled to the anode of the PIN-type photodiode, and a second electrode plate of the storage capacitor is coupled to the cathode of the PIN-type photodiode. The first electrode plate is arranged at a same layer, and made of a same material, as the first electrode and the second electrode of the first control transistor, the cathode of the PIN-type photodiode is reused as the second electrode plate of the storage capacitor coupled to the cathode of the PIN-type photodiode, and an orthogonal projection of the first electrode plate onto the base is located within an orthogonal projection of the second electrode plate onto the base.

In a possible embodiment of the present disclosure, the display substrate further includes a second sensing signal line and a second control signal line; the subpixel further includes an electrical detection circuitry, and the electrical detection circuitry includes a second control transistor, a first electrode of the second control transistor is coupled to an anode of the light-emitting element, a second electrode of the second control transistor is coupled to the second sensing signal line, and a gate electrode of the second control transistor is coupled to the second control signal line; the same second control signal line is shared by the electrical detection circuitries in a same row in the first direction; the same second sensing signal line is shared by the electrical detection circuitries in a same column in the second direction.

In a possible embodiment of the present disclosure, the same second sensing signal line is shared by the electrical detection circuitries in at least two adjacent columns.

In a possible embodiment of the present disclosure, the first sensing signal lines and the second sensing signal lines are arranged alternately, and at least two columns of subpixels are arranged between the first sensing signal line and the second sensing signal line adjacent to each other.

In a possible embodiment of the present disclosure, the display substrate further includes data lines corresponding to the columns of subpixels respectively, each of the data lines is coupled to the subpixel driving circuitries of the subpixels in the column corresponding to the data line; at least one column of subpixels is arranged between the data line and the first sensing signal line; at least one column of subpixels is arranged between the data line and the second sensing signal line.

In a possible embodiment of the present disclosure, in the electrical detection circuitries in four adjacent columns, the subpixels corresponding to the electrical detection circuitries in a same row may form a pixel unit configured to emit white light.

In a possible embodiment of the present disclosure, each of the subpixel groups includes eight subpixels arranged in an array form, the eight subpixels are arranged in two adjacent rows, four of the eight subpixels are in a same row, and form a pixel unit of the display substrate, and the pixel unit is configured to emit white light.

In a possible embodiment of the present disclosure, the first control transistor includes an oxide thin film transistor.

In a possible embodiment of the present disclosure, the display substrate further includes a first planarization layer arranged between the first control transistor and the PIN-type photodiode.

Based on the above technical solutions of the display substrate, in a second aspect, the present disclosure provides a display device including the above-mentioned display substrate.

Based on the above technical solutions of the display substrate, in a third aspect, the present disclosure provides a method for manufacturing the above-mentioned display substrate, including forming on the base the plurality of subpixels arranged in the array form, wherein the forming on the base the plurality of subpixels arranged in the array form includes: forming on the base the subpixel driving circuitry and the first control transistor of the light-emission detection circuitry of each of the subpixels; forming the PIN-type photodiode of each light-emission detection circuitry at a side of the first control transistor distal to the base, the first electrode of the first control transistor being coupled to the cathode of the corresponding PIN-type photodiode, the orthogonal projection of the first control transistor onto the base at least partially overlapping the orthogonal projection of the corresponding PIN-type photodiode onto the base; and forming the light-emitting element of each the subpixels at a side of the PIN-type photodiode distal to the base, the light-emitting element being coupled to the corresponding subpixel driving circuitry.

In a possible embodiment of the present disclosure, a first planarization layer is formed between the first control transistor and the PIN-type photodiode.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

In order to further explain the display panel, the manufacturing method thereof, and the display device provided by the embodiments of the present disclosure, the present disclosure will be described hereinafter in conjunction with the drawings.

An OLED display substrate includes a plurality of subpixels arranged in an array form, and each of the subpixels includes a subpixel driving circuitry and a light-emitting element coupled to each other. During the operation, the subpixel driving circuitry is configured to apply a driving current to the corresponding light-emitting element, so as to drive the light-emitting element to emit light in a corresponding color. In use, luminescence of light emitted by the light-emitting element in the OLED display substrate may change. In order to prevent a display effect from being adversely affected by the change in the luminescence of light emitted by the light-emitting element, usually the subpixel is provided with a light-emission detection circuitry for detecting a brightness of light emitted by the light-emitting element. The light-emission detection circuitry mainly includes a detection switching transistor and a PIN-type photodiode. When an intensity of the light emitted by the light-emitting element is detected by the light-emission detection circuitry, the PIN-type photodiode receives the light emitted by the light-emitting element, and converts the received light into an electric signal, so as to compensate the light emitted by the light-emitting element in accordance with the electric signal acquired after conversion.

In actual use, in order to ensure high compensation accuracy and a large signal-to-noise ratio, usually the PIN-type photodiode has a relatively large area. However, due to the large area of the PIN-type photodiode, an area occupied by the light-emission detection circuitry as a whole may be relatively large, and thereby an aperture ratio of the display substrate may decrease.

Figure 1:
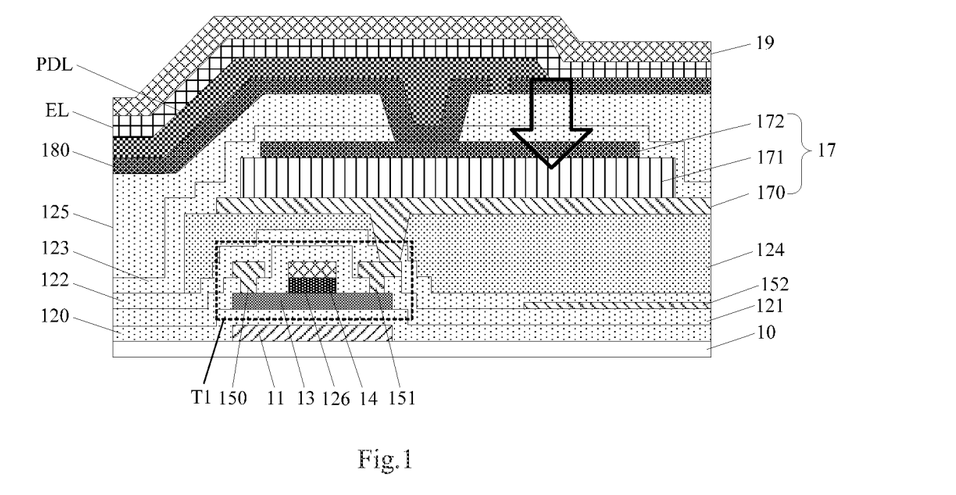
FIG. 1 is a first sectional view of a light-emission detection element according to an embodiment of the present disclosure.
Figure 2:
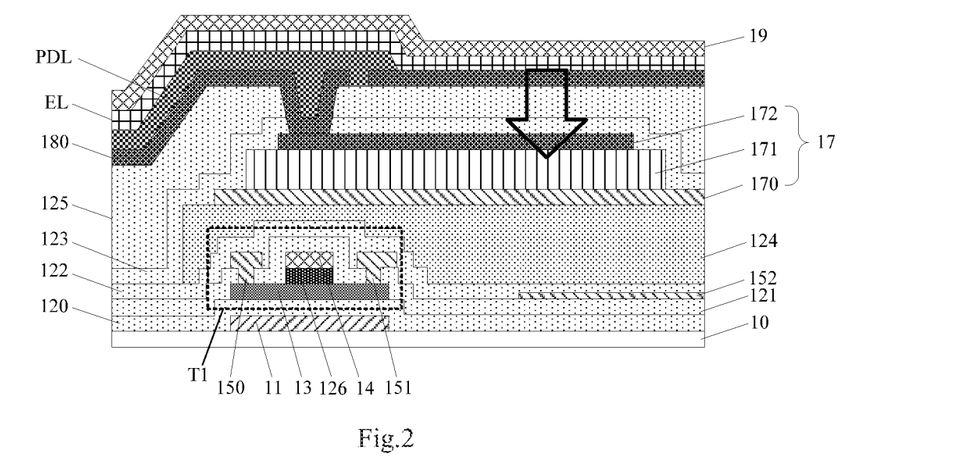
FIG. 2 is a second sectional view of the light-emission detection element according to an embodiment of the present disclosure.
Figure 3:
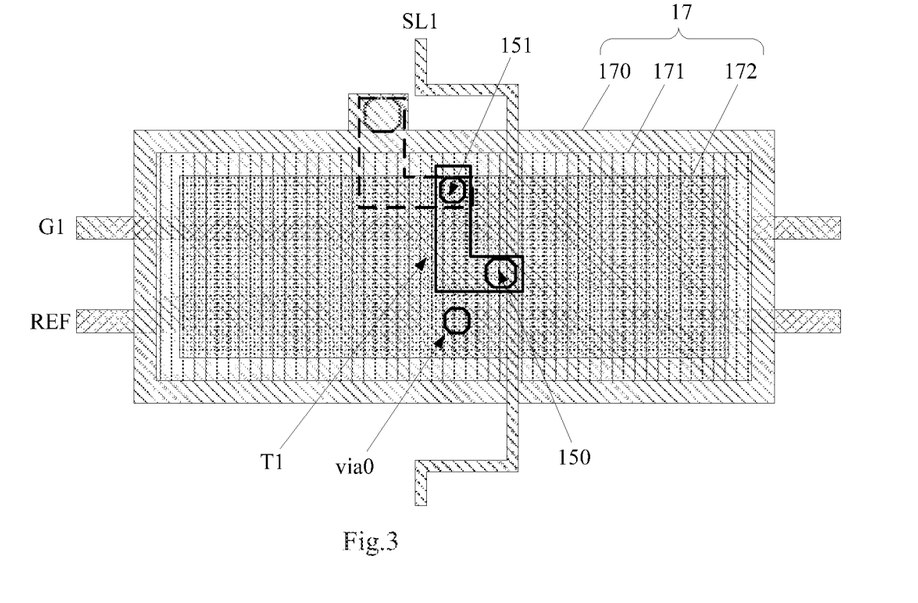
FIG. 3 is a top view of the light-emission detection element according to an embodiment of the present disclosure.

As shown in FIGS. 1 to 3, the present disclosure provides in some embodiments a display substrate, which includes a base 10 and a plurality of subpixels arranged on the base 10 in an array form. Each subpixel includes a light-emitting element, a subpixel driving circuitry coupled to the light-emitting element, and a light-emission detection circuitry configured to detect luminescence of light emitted by the light-emitting element. The light-emission detection circuitry includes a first control transistor T1 and a PIN-type photodiode 17 laminated in that order in a direction away from the base 10, a first electrode 151 of the first control transistor T1 is coupled to a cathode 170 of the PIN-type photodiode 17, and an orthogonal projection of the first control transistor T1 onto the base 10 at least partially overlaps an orthogonal projection of the PIN-type photodiode 17 onto the base 10.

To be specific, the base 10 of the display substrate may be, but not limited to, a glass base 10. Colors of light emitting by the light-emitting elements of the subpixels in the display substrate may be set according to the practical need. For example, the light-emitting element of each subpixel in the display substrate may emit white light, and in this case, the display substrate may further include a color filter structure, which includes color resist patterns in at least three colors, e.g., a red color resist pattern, a green color resist pattern and a blue color resist pattern. The color resist patterns may correspond to the light-emitting elements respectively, so as to enable the light emitted by the light-emitting element to exit the display substrate through the color resist pattern corresponding to the light-emitting element, thereby to achieve a display function of the display substrate.

Figure 5:
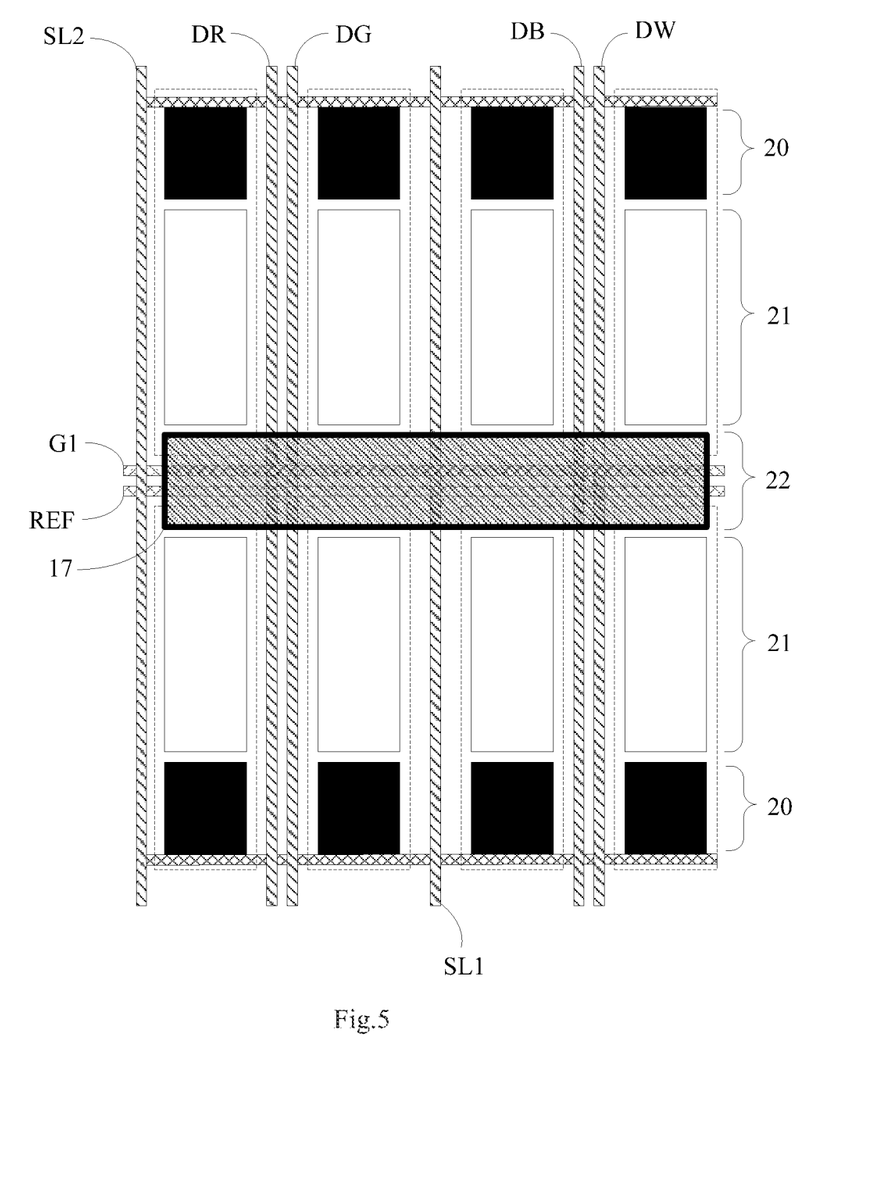
FIG. 5 is a top view of a display substrate according to an embodiment of the present disclosure.

It should be appreciated that, the subpixels in a same column may correspond to the color resist patterns in a same color. As shown in FIG. 5, the subpixels in a first column from the left may correspond to a red color resist pattern and a data line DR, and may emit red light. The subpixels in a second column from the left may correspond to a green color resist pattern and a data line DG, and may emit green light. The subpixels in a third column from the left may correspond to a blue color resist pattern and a data line DB, and may emit blue light. The subpixels in a fourth column may correspond to a white color resist pattern and a data line DW, and may emit white light.

In the display substrate, each subpixel may further include the subpixel driving circuitry and the light-emission detection circuitry. Positions of the subpixel driving circuitry and the light-emission detection circuitry may be set according to the practical need. For example, as shown in FIG. 5, in each subpixel, a first arrangement region 20 of the subpixel driving circuitry may be arranged opposite to a second arrangement region 22 of the light-emission detection circuitry, an aperture region 21 of the subpixel may be arranged between the first arrangement region 20 of the subpixel driving circuitry and the second arrangement region 22 of the light-emission detection circuitry.

The subpixel driving circuitry may include at least one driving thin film transistor and a plurality of switching thin film transistors. These thin film transistors may cooperate with each other, so that the driving thin film transistor may generate a driving signal and the driving signal may be transmitted to the corresponding light-emitting element, so as to drive the corresponding light-emitting element to emit light.

The light-emission detection circuitry may include the first control transistor T1 and the PIN-type photodiode 17, and the first electrode 151 of the first control transistor T1 may be coupled to the cathode 170 of the PIN-type photodiode 17. During the arrangement of the light-emission detection circuitry, in the embodiments of the present disclosure, the first control transistor T1 and the PIN-type photodiode 17 may be laminated one on another, and the first control transistor T1 may be arranged between the base 10 and the PIN-type photodiode 17, so that the orthogonal projection of the first control transistor T1 onto the base 10 at least partially overlaps the orthogonal projection of the PIN-type photodiode 17 onto the base 10. In this way, in a direction perpendicular to the base 10, the PIN-type photodiode 17 may shield at least a part of the first control transistor T1.

It should be appreciated that, in the embodiments of the present disclosure, the display substrate may be a bottom-emission display substrate, i.e., light may exit at a side of the display substrate where the base 10 is located. During the arrangement of the first control transistor T1 and the PIN-type photodiode 17 of the display substrate, a technique similar to top-emission may be adopted, i.e., the first control transistor T1 may be arranged between the base 10 and the PIN-type photodiode 17. In addition, as shown in FIG. 1, the display substrate may further include a light-shielding layer 11, a buffer layer 120, a first insulation layer 121, a first passivation layer 122, a second passivation layer 123, a second planarization layer 125, a gate insulation layer 126 and a pixel definition layer PDL. The first control transistor T1 may further include an active layer 13 and a gate electrode pattern 14. The light-emitting element may include an anode 180 of the light-emitting element, a cathode 19 of the light-emitting element and an organic light-emitting material layer EL.

During the operation of the light-emission detection circuitry, the PIN-type photodiode 17 may receive the light emitted by the light-emitting element corresponding to the PIN-type photodiode 17, convert it into an electric signal, and transmit the electric signal to a chip of the display substrate through the first control transistor T1. The chip may compensate for the luminescence of light emitted by the light-emitting element in the display substrate in accordance with the electric signal, so as to provide the display substrate with uniform display brightness.

Based on the specific structure of the above display substrate, in the display panel of the embodiments of the present disclosure, the first control transistor T1 and the PIN-type photodiode 17 of the light-emission detection circuitry in each subpixel may be laminated in that order in the direction away from the base 10, and the orthogonal projection of the first control transistor T1 onto the base 10 may at least partially overlap the orthogonal projection of the PIN-type photodiode 17 onto the base 10, so as to enable the PIN-type photodiode 17 to shield at least a part of the first control transistor T1, and reduce an area occupied by the light-emission detection circuitry in a direction parallel to the base 10, thereby to effectively increase an aperture ratio of each subpixel. Moreover, in the display substrate according to the embodiments of the present disclosure, the first control transistor T1 may be arranged between the base 10 and the PIN-type photodiode 17, and the light-emitting element may be arranged at a side of the PIN-type photodiode 17 distal to the base 10, it is able to ensure the light sensing accuracy of the PIN-type photodiode 17 while increasing the aperture ratio of the display substrate, thereby to improve the brightness uniformity of the display substrate.

In some embodiments of the present disclosure, the PIN-type photodiode 17 may include a cathode 170, a photovoltaic conversion structure 171 and an anode 172 laminated in that order in the direction away from the base 10, the cathode 170 may be made of a light-shielding material, and the orthogonal projection of the first control transistor T1 onto the base 10 may be located within an orthogonal projection of the cathode 170 onto the base 10.

To be specific, the cathode 17 of the PIN-type photodiode 17 may be made of a light-shielding material, e.g., a metal material having a light-shielding property. The anode 172 of the PIN-type photodiode 17 may be made of a light-transmitting material, e.g., an indium tin oxide material.

The photovoltaic conversion structure 171 may include a PN junction and an I-type semiconductor layer doped into the PN junction at a very low concentration. Due to the low concentration of the doped I-type semiconductor, the doped I-type semiconductor is almost an intrinsic semiconductor, so the I-type semiconductor layer may also be called as an I layer. A P-type semiconductor and an N-type semiconductor each at a very high doping concentration, i.e., a P layer and an N layer, may be arranged at two sides of the I layer respectively. The P layer and the N layer are each very thin, and they may absorb incident light at a very tiny proportion, so most of the incident light may be absorbed by the I layer and thereby a large quantity of electron-hole pairs may be generated therein. The I layer is relatively thick and it almost occupies an entire depletion region. Hence, through increasing a width of the depletion region, it is able to reduce the influence caused by diffusion movement, and increase a response speed of the photodiode.

In the embodiments of the present disclosure, when the anode is made of the light-transmitting material, the PIN-type photodiode 17 may receive the light emitted from the corresponding light-emitting element in a better manner, so as to ensure the detection accuracy of the light-emission detection circuitry. Moreover, in the embodiments of the present disclosure, when the cathode is made of the light-shielding material and the orthogonal projection of the first control transistor T1 onto the base 10 is located within the orthogonal projection of the cathode onto the base 10, the first control transistor T1 may be completely covered by the PIN-type photodiode 17. In this way, it is able to reduce the area occupied by the light-emission detection circuitry in the direction parallel to the base 10 to the greatest extent, and enable the area occupied by the light-emission detection circuitry in the direction parallel to the base 10 to be merely equal to the area occupied by the PIN-type photodiode 17. In addition, it is able to prevent the first control transistor T1 from being adversely affected by light, and provide the light-emission detection circuitry with a relatively small dark current (i.e., an off-state current of the first control transistor T1), thereby to effectively increase a signal-to-noise ratio of the light-emission detection circuitry.

As shown in FIG. 5, in some embodiments of the present disclosure, the plurality of subpixels are divided into a plurality of subpixel groups arranged in an array form, each subpixel group may include at least four subpixels arranged in an array form, the at least four subpixels may be arranged in two adjacent rows, a same light-emission detection circuitry may be shared by the subpixels in a same subpixel group, and the orthogonal projection of the PIN-type photodiode 17 in the light-emission detection circuitry onto the base 10 may overlap orthogonal projections of the light-emitting elements of the subpixels in the subpixel group corresponding to light-emission detection circuitry onto the base 10.

To be specific, in the display substrate, the plurality of subpixels may be divided into a plurality of subpixel groups arranged in an array form, each subpixel group may include at least four subpixels arranged adjacent to each other in an array form, and the at least four subpixels may be arranged in two adjacent rows. For example, each subpixel group may include eight subpixels, which include four subpixels arranged in one row and four subpixels in an adjacent row. More specifically, the four subpixels in a same row may correspond to a red color resist unit, a green color resist unit, a blue color resist unit and a white color resist unit respectively, so that the four subpixels in the same row may form one pixel unit in the display substrate. Identically, the four subpixels in the adjacent row may correspond to a red color resist unit, a green color resist unit, a blue color resist unit and a white color resist unit respectively, so that the four subpixels in the adjacent row may form one pixel unit in the display substrate.

In the display substrate according to the embodiments of the present disclosure, when the same light-emission detection circuitry is shared by the subpixels in a same subpixel group, the orthogonal projection of the PIN-type photodiode 17 in the light-emission detection circuitry onto the base 10 may overlap the orthogonal projections of the light-emitting elements in the subpixels in the corresponding subpixel group onto the base 10. In this way, the light-emission detection circuitry may receive the light emitted by the light-emitting element in each subpixel in the subpixel group corresponding to the light-emission detection circuitry, so as to perform the light-emission detection on the light-emitting element of each subpixel in the subpixel group corresponding to the light-emission detection circuitry.

In the display substrate according to the embodiments of the present disclosure, when the same light-emission detection circuitry is shared by the subpixels in the same subpixel group, it is able to further reduce the area occupied by the light-emission detection circuitry in the display substrate, thereby to increase the aperture ratio of the display substrate.

Moreover, when the same light-emission detection circuitry is shared by the subpixels in the same subpixel group, it is able to reduce the quantity of vertices of the PIN-type photodiode 17 of the light-emission detection circuitry in the display substrate, thereby to further reduce the dark current of the light-emission detection circuitry. More specifically, when the orthogonal projection of the PIN-type photodiode 17 onto the base 10 is a quadrilateral (i.e., having four vertices) and one light-emission detection circuitry is shared by eight subpixels, the eight subpixels may correspond to one PIN-type photodiode 17, i.e., correspond to four vertices. However, when the eight subpixels correspond to eight PIN-type photodiode 17, the eight subpixels may correspond to thirty-two vertices.

Figure 4:
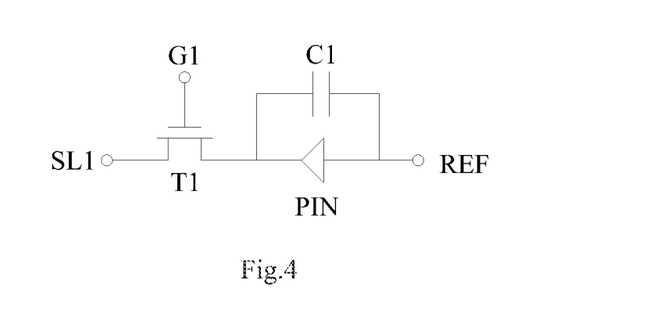
FIG. 4 is a schematic view showing the light-emission detection element according to an embodiment of the present disclosure.

As shown in FIGS. 3 and 4, the display substrate provide by the above embodiments may further include a reference signal line REF, a first sensing signal line SL1 and a first control signal line G1. The reference signal line REF may be coupled to the anode 172 of the PIN-type photodiode 17 through a via-hole via0, the first sensing signal line SL1 may be coupled to a second electrode 150 of the first control transistor T1, the first control signal line G1 may be coupled to a gate electrode of the first control transistor T1, and a first electrode 151 of the first control transistor T1 may be coupled to the cathode 170 of the PIN-type photodiode 17 through a pattern indicated by a dashed box in FIG. 3.

As shown in FIG. 5, the plurality of subpixels may be arranged in rows and columns, each of the rows of subpixels may include a plurality of subpixels arranged sequentially in a first direction, and each of columns of subpixels may include a plurality of subpixels arranged sequentially in a second direction intersecting with the first direction. A same reference signal line REF and a same first control signal line G1 may be shared by the light-emission detection circuitries in a same row in the first direction, and a same first sensing signal line SL1 may be shared by the light-emission detection circuitries in a same column in the second direction.

To be specific, the plurality of subpixels in the display substrate may be arranged in an array form, i.e., the plurality of subpixels may be divided into a plurality of rows or a plurality of columns. Each of the rows of subpixels may include a plurality of subpixels arranged sequentially in the first direction, and each of columns of subpixels may include a plurality of subpixels arranged sequentially in the second direction intersecting the first direction. For example, the first direction may be perpendicular to the second direction.

The display substrate may further include a plurality of reference signal lines REF, a plurality of first sensing signal lines SL1 and a plurality of first control signal lines G1. In each light-emission detection circuitry of the display substrate, the anode 172 of the PIN-type photodiode 17 may be coupled to the reference signal line REF corresponding to the light-emission detection circuitry, the second electrode 150 of the first control transistor T1 may be coupled to the first sensing signal line SL1 corresponding to the light-emission detection circuitry, and the gate electrode of the first control transistor T1 may be coupled to the first control signal line G1 corresponding to the light-emission detection circuitry.

It should be appreciated that, the plurality of reference signal lines REF, the plurality of first sensing signal lines SL1 and the plurality of first control signal lines G1 may be arranged in various modes. For example, as shown in FIG. 5, a same reference signal line REF and a same first control signal line G1 may be shared by the light-emission detection circuitries in a same row in the first direction, and a same first sensing signal line SL1 may be shared by the light-emission detection circuitries in a same column in the second direction. In this arrangement mode, a driving mode similar to that for a gate line and a data line in the display substrate may be adopted, i.e., the first control transistors T1 may be turned on row by row progressively under the control of the first control signal lines G1, and when the first control transistors T1 in a certain row have been turned on, sensing signals acquired by the PIN-type photodiodes 17 in the row may be transmitted through the plurality of first sensing signal lines SL1.

It should be appreciated that, the above arrangement mode may be applied to such a condition where one light-emission detection circuitry is shared by a plurality of subpixels and a condition where each subpixel includes an individual light-emission detection circuitry.

In the display substrate according to the embodiments of the present disclosure, when the same reference signal line REF and the same first control signal line G1 are shared by the light-emission detection circuitries in a same row in the first direction and the same first sensing signal line SL1 is shared by the light-emission detection circuitries in a same column in the second direction, it is able to remarkably reduce the quantity of the reference signal lines REF, the first sensing signal lines SL1 and the first control signal lines G1 in the display substrate, thereby to reduce the layout complexity of the display substrate and further increase a resolution of the display substrate.

As shown in FIGS. 3 and 5, in some embodiments of the present disclosure, an orthogonal projection of the reference signal line REF onto the base 10 may overlap orthogonal projections of the PIN-type photodiodes 17 coupled to the reference signal line onto the base 10, and/or an orthogonal projection of the first control signal line G1 onto the base 10 may overlap the orthogonal projections of the PIN-type photodiodes 17 in the light-emission detection circuitries coupled to the first control signal line onto the base 10.

To be specific, when the same reference signal line REF and the same first control signal line G1 are shared by the light-emission detection circuitries in a same row in the first direction and the same first sensing signal line SL1 is shared by the light-emission detection circuitries in a same column in the second direction, the reference signal line REF and the first control signal line G1 may each extend in the first direction, and the first sensing signal line SL1 may extend in the second direction.

It should be appreciated that, the arrangement modes of the reference signal line REF and the first control signal line G1 may be set according to the practical need, as long as the reference signal line REF is coupled to the anode 172 of each PIN-type photodiode 17 in the light-emission detection circuitries in a row corresponding to the reference signal line REF, and the first control signal line G1 is coupled to the gate electrode of each first control transistor T1 in the light-emission detection circuitries in the row corresponding to the first control signal line G1. For example, the orthogonal projection of the reference signal line REF onto the base 10 may overlap each of the orthogonal projections of the PIN-type photodiodes 17 coupled thereto onto the base 10, and/or the orthogonal projection of the first control signal line G1 onto the base 10 may overlap the orthogonal projections of the PIN-type photodiodes 17 in the light-emission detection circuitries coupled thereto onto the base 10. Through this arrangement mode, it is able for the reference signal line REF and/or the first control signal line G1 to overlap the PIN-type photodiodes in a direction perpendicular to the base 10, thereby to further increase the aperture ratio of the display substrate while ensuring the normal operation of the light-emission detection circuitries.

Further, the reference signal line REF and the first control signal line G1 may be arranged between the base 10 and the PIN-type photodiode, so as to prevent a light-receiving surface of the PIN-type photodiode from being shielded by the reference signal line REF and the first control signal line G1.

As shown in FIGS. 1, 2 and 4, in some embodiments of the present disclosure, the light-emission detection circuitry may further include a storage capacitor C1, a first electrode plate 152 of which is coupled to the anode 172 of the PIN-type photodiode 17, and a second electrode plate of which is coupled to the cathode 170 of the PIN-type photodiode 17. The first electrode plate 152 may be arranged at a same layer, and made of a same material, as the first electrode 151 and the second electrode 150 of the first control transistor T1, the cathode 170 of the PIN-type photodiode 17 may be reused as the second electrode plate of the storage capacitor C1 coupled to the cathode of the PIN-type photodiode, and an orthogonal projection of the first electrode plate 152 onto the base 10 may be located within an orthogonal projection of the second electrode plate onto the base 10.

To be specific, each light-emission detection circuitry in the display substrate may further include the storage capacitor C1 coupled between the anode 172 and the cathode 170 of the PIN-type photodiode 17 and configured to store the electric signal acquired by the PIN-type photodiode 17 through conversion.

A specific arrangement mode of the storage capacitor C1 may be selected according to the practical need. For example, the first electrode plate 152 of the storage capacitor C1 may be arranged at a same layer, and made of a same material, as the first electrode 151 and the second electrode 150 of the first control transistor T1, and the cathode 170 of the PIN-type photodiode 17 may be reused as the second electrode plate of the storage capacitor C1 coupled thereto. Through this arrangement mode, it is able to prevent an additional process dedicated for forming the second electrode plate of the storage capacitor C1, and form the first electrode plate 152 of the storage capacitor C1 and the first electrode 151 and the second electrode 150 of the first control transistor T1 through a single patterning process, thereby to simplify the manufacture of the storage capacitor C1 in a better manner and reduce the manufacture cost of the display substrate. In addition, when the orthogonal projection of the first electrode plate 152 onto the base 10 is located within the orthogonal projection of the second electrode plate onto the base 10, it is able to provide the first electrode plate 152 of the storage capacitor C1 with an area directly facing the second electrode plate in the direction perpendicular to the base 10, completely cover the storage capacitor C1 using the PIN-type photodiode 17, and prevent the area occupied by the light-emission detection circuitry in the direction parallel to the base 10 from increasing due to the storage capacitor C1, thereby to ensure that the area occupied by the light-emission detection circuitry is just the light-receiving area of the PIN-type photodiode 17 in the light-emission detection circuitry in the direction parallel to the base 10.

It should be appreciated that, the cathode 170, the photovoltaic conversion structure 171 and the anode 172 of the PIN-type photodiode 17 may have a substantially same area in the direction parallel to the base, and an orthogonal projection of the cathode 170 onto the base 10, an orthogonal projection of the photovoltaic conversion structure 171 onto the base 10 and an orthogonal projection of the anode 172 onto the base 10 may substantially coincide with each other. The light-receiving area of the PIN-type photodiode may be an area of the anode 172 in the direction parallel to the base 10, or an area of the photovoltaic conversion structure 171 in the direction parallel to the base 10.

As shown in FIG. 5, in some embodiments of the present disclosure, the display substrate may further include a second sensing signal line SL2 and a second control signal line. The subpixel may further include an electrical detection circuitry, and the electrical detection circuitry may include a second control transistor, a first electrode of which is coupled to the anode 180 of the light-emitting element, a second electrode of which is coupled to the second sensing signal line SL2, and a gate electrode of which is coupled to the second control signal line. A same second control signal line may be shared by the electrical detection circuitries in a same row in the first direction, and a same second sensing signal line SL2 may be shared by the electrical detection circuitries in a same column in the second direction.

To be specific, the display substrate may further include a plurality of second sensing signal lines SL2 and a plurality of second control signal lines. Each subpixel in the display substrate may further include an electrical detection circuitry, and the electrical detection circuitry may be of various structures. For example, the electrical detection circuitry may include the second control transistor, a gate electrode of which is coupled to the second control signal line corresponding to the electrical detection circuitry, a first electrode of which is coupled the anode 180 of the light-emitting element, and a second electrode of which is coupled to the second sensing signal line SL2 corresponding to the electrical detection circuitry. A specific operating procedure of the electrical detection circuitry will be described as follows.

At a resetting phase, a resetting signal may be written into the second sensing signal line SL2, and under the control of a second control signal inputted from the second control signal line, the second control transistor may be turned on, so as to transmit the resetting signal to the anode 180 of the light-emitting element, so as to reset the light-emitting element.

At a sensing phase, under the control of the second control signal inputted from the second control signal line, the second control transistor may be turned on, so as to transmit a voltage signal of the anode 180 of the light-emitting element to the second sensing signal line SL2, and transmit the voltage signal to the chip of the display substrate through the second sensing line SL2 for subsequent electrical compensation.

It should be appreciated that, the plurality of second sensing signal lines SL2 and the plurality of second control signal lines may be arranged in various modes. For example, the same second control signal line may be shared by the electrical detection circuitries in a same row in the first direction, and the same second sensing signal line SL2 may be shared by the electrical detection circuitries in a same column in the second direction. Through this arrangement mode, a driving mode similar to that for a gate line and a data line in the display substrate may be adopted, i.e., the second control transistors T1 may be turned on row by row progressively under the control of the second control signal lines, and when the second control transistors in a certain row have been turned on, the anodes 180 of the light-emitting element in the row may be reset using the resetting signals transmitted through the plurality of second sensing signal lines SL2, or the voltage signals for the anodes 180 of the light-emitting elements in the row may be transmitted to the chip of the display substrate through the plurality of second sensing signal lines SL2.

In the display substrate according to the embodiments of the present disclosure, when the same second control signal line is shared by the electrical detection circuitries in a same row in the first direction and the same second sensing signal line SL2 is shared by the electrical detection circuitries in a same column in the second direction, it is able to remarkably reduce the quantity of the second sensing signal lines SL2 and the second control signal lines in the display substrate, thereby to reduce the layout complexity of the display substrate and further increase the resolution of the display substrate.

In some embodiments of the present disclosure, a same second sensing signal line SL2 may be shared by the electrical detection circuitries in at least two adjacent columns.

For example, a same second sensing signal line SL2 may be shared by the electrical detection circuitries in four adjacent columns. In the electrical detection circuitries in four adjacent columns, the subpixels corresponding to the electrical detection circuitries in a same row may correspond to a red color resist unit, a green color resist unit, a blue color resist unit and a white color resist unit respectively, so that the four subpixels in a same row may form one pixel unit of the display substrate.

In the above embodiments, when the same second sensing signal line SL2 is shared by the electrical detection circuitries in at least two adjacent columns, it is able to further reduce the quantity of the second sensing signal lines SL2 in the display substrate, thereby to further reduce the layout complexity of the display substrate and increase the resolution of the display substrate.

As shown in FIG. 5, in some embodiments of the present disclosure, the first sensing signal lines SL1 and the second sensing signal lines SL2 may be arranged alternately, and at least two columns of subpixels may be arranged between the first sensing signal line SL1 and the second sensing signal line SL2 adjacent to each other.

To be specific, in the display substrate according to the embodiments of the present disclosure, the first sensing signal line SL1 and the second sensing signal line SL2 may each extend in the second direction. During the arrangement of the first sensing signal lines SL1 and the second sensing signal lines SL2, the first sensing signal lines SL1 and the second sensing signal lines SL2 may be arranged alternately, and at least two columns of subpixels may be arranged between the first sensing signal line SL1 and the second sensing signal line SL2 adjacent to each other. In this arrangement mode, it is able to provide a relatively large distance between the first sensing signal line SL1 and the second sensing signal line SL2, thereby to effectively prevent the occurrence of crosstalk between the first sensing signal line SL1 and the second sensing signal line SL2 adjacent to each other, and effectively increase the signal-to-noise ratio of the light-emission detection circuitry and the electrical detection circuitry.

As shown in FIG. 5, in some embodiments of the present disclosure, the display substrate may further include data lines (e.g., DR, DG, DB and DW in FIG. 5) corresponding to the columns of subpixels respectively, each data line may be coupled to the subpixel driving circuitries of the subpixels in the column corresponding to the data line, at least one column of subpixels may be arranged between the data line and the first sensing signal line SL1, and at least one column of subpixels may be arranged between the data line and the second sensing signal line SL2.

To be specific, when the display substrate further includes the data lines corresponding to the columns of subpixels respectively, the data line is configured to apply a data signal to the subpixel driving circuitry in each subpixel in the column corresponding to the data line, so as to enable the subpixel driving circuitry to generate a driving signal for driving the light-emitting element to emit light in accordance with the data signal.

In the above embodiments, when at least one column of subpixels is arranged between the data line and the first sensing signal line SL1 and at least one column of subpixels is arranged between the data line and the second sensing signal line SL2, it is able to provide a relatively large distance between the data line and the first sensing signal line SL1, and provide a relatively large distance between the data line and the second sensing signal line SL2, thereby to effectively prevent the occurrence of crosstalk between the data line and the first sensing signal line SL1 adjacent to each other, and effectively prevent the occurrence of crosstalk between the data line and the second sensing signal line SL2 adjacent to each other, thereby to effectively improve the operating stability of the display substrate In some embodiments of the present disclosure, the first control transistor T1 may include an oxide thin film transistor.

To be specific, the oxide thin film transistor has such advantages as high mobility, large area and excellent uniformity, so when the first control transistor T1 includes the oxide thin film transistor, it is able to provide the light-emission detection circuitry with excellent detection performance, thereby to further improve the detection accuracy of the light-emission detection circuitry.

As shown in FIGS. 1 and 2, in some embodiments of the present disclosure, the display substrate may further include a first planarization layer 124 arranged between the first control transistor T1 and the PIN-type photodiode 17.

To be specific, due to a segment difference at a surface of the first control transistor T1 distal to the base 10, in order to ensure the flatness of the PIN-type photodiode 17 formed subsequently, the first planarization layer 124 may be arranged between the first control transistor T1 and the PIN-type photodiode 17. The first planarization layer 24 may be made of an organic insulating material of Silicon On Glass (SOG).

When the first planarization layer 124 is formed at a side of the first control transistor T1 distal to the base 10 and the PIN-type photodiode 17 is formed at a side of the first planarization layer 124 distal to the base 10, it is able to provide the PIN-type photodiode 17 with high flatness, thereby to further ensure the excellent operating performance of the PIN-type photodiode 17.

The present disclosure further provides in some embodiments a display device including the above-mentioned display substrate.

In the display substrate according to the embodiments of the present disclosure, the first control transistor T1 and the PIN-type photodiode 17 of the light-emission detection circuitry in each subpixel may be laminated in that order in the direction away from the base 10, and the orthogonal projection of the first control transistor T1 onto the base 10 may at least partially overlap the orthogonal projection of the PIN-type photodiode 17 onto the base 10, so as to enable the PIN-type photodiode 17 to shield at least a part of the first control transistor T1, and reduce an area occupied by the light-emission detection circuitry in a direction parallel to the base 10, thereby to effectively increase an aperture ratio of each subpixel. Moreover, in the display substrate according to the embodiments of the present disclosure, the first control transistor T1 may be arranged between the base 10 and the PIN-type photodiode 17, and the light-emitting element may be arranged at a side of the PIN-type photodiode 17 distal to the base 10, it is able to ensure the light sensing accuracy of the PIN-type photodiode 17 while increasing the aperture ratio of the display substrate, thereby to further improve the brightness uniformity of the display substrate. Hence, when the display device includes the above-mentioned display substrate in the embodiments of the present disclosure, it may also have all the above-mentioned beneficial effects of the above-mentioned display substrate, which will not be particularly defined herein.

It should be appreciated that, the display device may be any product or member having a display function, e.g., television, display, digital photo frame, mobile phone or table computer.

The present disclosure further provides in some embodiments a method for manufacturing the above-mentioned display substrate, which includes forming a plurality of subpixels arranged on the base 10 in an array form. The forming the plurality of subpixels arranged on the base in an array form may include: forming the subpixel driving circuitry and the first control transistor T1 of the light-emission detection circuitry of each subpixel on the base 10; forming the PIN-type photodiode 17 of each light-emission detection circuitry at a side of the first control transistor T1 distal to the base 10, the first electrode 151 of the first control transistor T1 being coupled to the cathode 170 of the corresponding PIN-type photodiode 17, an orthogonal projection of the first control transistor T1 onto the base 10 at least partially overlapping an orthogonal projection of the corresponding PIN-type photodiode 17 onto the base 10; and forming the light-emitting element of each subpixel at a side of the PIN-type photodiode 17 distal to the base 10, the light-emitting element being coupled to the corresponding subpixel driving circuitry.

In the display substrate manufactured using the above-mentioned method, the first control transistor T1 and the PIN-type photodiode 17 of the light-emission detection circuitry in each subpixel may be laminated in that order in the direction away from the base 10, and the orthogonal projection of the first control transistor T1 onto the base 10 may at least partially overlap the orthogonal projection of the PIN-type photodiode 17 onto the base 10, so as to enable the PIN-type photodiode 17 to shield at least a part of the first control transistor T1, and reduce an area occupied by the light-emission detection circuitry in a direction parallel to the base 10, thereby to effectively increase an aperture ratio of each subpixel. Moreover, in the display substrate manufactured using the above-mentioned method according to the embodiments of the present disclosure, the first control transistor T1 may be arranged between the base 10 and the PIN-type photodiode 17, and the light-emitting element may be arranged at a side of the PIN-type photodiode 17 away from the base 10, it is able to ensure the light sensing accuracy of the PIN-type photodiode 17 while increasing the aperture ratio of the display substrate, thereby to further improve the brightness uniformity of the display substrate.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "comprise" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any one or more embodiments or examples in an appropriate manner.

The above are specific implementations of the present disclosure, but the protection scope of the present disclosure is not limited thereto. Any person skilled in the art may make further modifications and improvements without departing from the principle of the present disclosure, and these modifications and improvements shall also fall within the scope of the present disclosure. The protection scope of the present disclosure is defined by the claims.

The invention claimed is:

1. A display substrate, comprising a base and a plurality of subpixels arranged on the base in an array form, wherein each of at least one of the subpixels comprises a light-emitting element, a subpixel driving circuitry coupled to the light-emitting element, and a light-emission detection circuitry capable of detecting luminescence of light emitted by the light-emitting element, the light-emission detection circuitry comprises a first control transistor and a PIN-type photodiode laminated in that order in a direction away from the base, a first electrode of the first control transistor is coupled to a cathode of the PIN-type photodiode, and an orthogonal projection of the first control transistor onto the base at least partially overlaps an orthogonal projection of the PIN-type photodiode onto the base;

the PIN-type photodiode comprises a cathode, a photovoltaic conversion structure and an anode laminated in that order in the direction away from the base;
the cathode is made of a light-shielding material, and the orthogonal projection of the first control transistor onto the base is located within an orthogonal projection of the cathode onto the base;
the display substrate further comprises a reference signal line, a first sensing signal line and a first control signal line, wherein the reference signal line is coupled to the anode of the PIN-type photodiode, the first sensing signal line is coupled to a second electrode of the first control transistor, the first control signal line is coupled to a gate electrode of the first control transistor; and
an orthogonal projection of the reference signal line onto the base overlaps each of orthogonal projections of the PIN-type photodiodes coupled to the reference signal line onto the base.

2. The display substrate according to claim 1, wherein the plurality of subpixels are divided into a plurality of subpixel groups arranged in an array form, each of the subpixel groups comprises at least four subpixels arranged in an array form, the at least four subpixels are arranged in two adjacent rows, the same light-emission detection circuitry is shared by the subpixels in a same one of the subpixel groups, and the orthogonal projection of the PIN-type photodiode in the light-emission detection circuitry onto the base overlaps orthogonal projections of the light-emitting elements of the subpixels in the subpixel group corresponding to the light-emission detection circuitry onto the base.

3. The display substrate according to claim 2, wherein
the plurality of subpixels comprise a plurality of rows of pixels and a plurality of columns of subpixels, each of the rows of subpixels comprises a plurality of subpixels arranged sequentially in a first direction, each of columns of subpixels comprises a plurality of subpixels arranged sequentially in a second direction intersecting with the first direction;
the same reference signal line and the same first control signal line are shared by the light-emission detection circuitries in a same row in the first direction;
the same first sensing signal line is shared by the light-emission detection circuitries in a same column in the second direction.

4. The display substrate according to claim 1, wherein the reference signal line and the PIN-type photodiode are laminated in that order in the direction away from the base.

5. The display substrate according to claim 3, wherein an orthogonal projection of the first control signal line onto the base overlaps each of orthogonal projections of the PIN-type photodiodes in the light-emission detection circuitries coupled to the first control signal line onto the base.

6. The display substrate according to claim 5, wherein the first control signal line and the PIN-type photodiode are laminated in that order in the direction away from the base.

7. The display substrate according to claim 3, wherein the light-emission detection circuitry further comprises a storage capacitor, a first electrode plate of the storage capacitor is coupled to the anode of the PIN-type photodiode, and a second electrode plate of the storage capacitor is coupled to the cathode of the PIN-type photodiode;
the first electrode plate is arranged at a same layer, and made of a same material, as the first electrode and the second electrode of the first control transistor;
the cathode of the PIN-type photodiode is reused as the second electrode plate of the storage capacitor coupled to the cathode of the PIN-type photodiode, and an orthogonal projection of the first electrode plate onto the base is located within an orthogonal projection of the second electrode plate onto the base.

8. The display substrate according to claim 3, wherein the display substrate further comprises a second sensing signal line and a second control signal line;
the subpixel further comprises an electrical detection circuitry, and the electrical detection circuitry comprises a second control transistor, a first electrode of the second control transistor is coupled to an anode of the light-emitting element, a second electrode of the second control transistor is coupled to the second sensing signal line, and a gate electrode of the second control transistor is coupled to the second control signal line;
the same second control signal line is shared by the electrical detection circuitries in a same row in the first direction;
the same second sensing signal line is shared by the electrical detection circuitries in a same column in the second direction.

9. The display substrate according to claim 8, wherein the same second sensing signal line is shared by the electrical detection circuitries in at least two adjacent columns.

10. The display substrate according to claim 9, wherein the first sensing signal lines and the second sensing signal lines are arranged alternately, and at least two of the columns of subpixels are arranged between the first sensing signal line and the second sensing signal line adjacent to each other.

11. The display substrate according to claim 10, wherein the display substrate further comprises data lines corresponding to the columns of subpixels respectively, each of the data lines is coupled to the subpixel driving circuitries of the subpixels in the column corresponding to the data line;
at least one column of subpixels is arranged between the data line and the first sensing signal line;
at least one column of subpixels is arranged between the data line and the second sensing signal line.

12. The display substrate according to claim 11, wherein in the electrical detection circuitries in four adjacent columns, the subpixels corresponding to the electrical detection circuitries in a same row form a pixel unit emitting white light.

13. The display substrate according to claim 2, wherein each of the subpixel groups comprises eight subpixels arranged in an array form, the eight subpixels are arranged in two adjacent rows, four of the eight subpixels are in a same row, and form a pixel unit of the display substrate, and the pixel unit emits white light.

14. The display substrate according to claim 1, wherein the first control transistor comprises an oxide thin film transistor.

15. The display substrate according to claim 1, wherein the display panel further comprises a first planarization layer arranged between the first control transistor and the PIN-type photodiode.

16. A display device, comprising a display substrate, wherein the display substrate comprises a base and a plurality of subpixels arranged on the base in an array form, each of at least one of the subpixels comprises a light-emitting element, a subpixel driving circuitry coupled to the light-emitting element, and a light-emission detection circuitry capable of detecting luminescence of light emitted by the light-emitting element, the light-emission detection circuitry comprises a first control transistor and a PIN-type photodiode laminated in that order in a direction away from the base, a first electrode of the first control transistor is coupled to a cathode of the PIN-type photodiode, and an orthogonal projection of the first control transistor onto the base at least partially overlaps an orthogonal projection of the PIN-type photodiode onto the base;
the PIN-type photodiode comprises a cathode, a photovoltaic conversion structure and an anode laminated in that order in the direction away from the base;
the cathode is made of a light-shielding material, and the orthogonal projection of the first control transistor onto the base is located within an orthogonal projection of the cathode onto the base;
the display substrate further comprises a reference signal line, a first sensing signal line and a first control signal line, wherein the reference signal line is coupled to the anode of the PIN-type photodiode, the first sensing signal line is coupled to a second electrode of the first control transistor, the first control signal line is coupled to a gate electrode of the first control transistor; and
an orthogonal projection of the reference signal line onto the base overlaps each of orthogonal projections of the PIN-type photodiodes coupled to the reference signal line onto the base.

* * * * *